(12) United States Patent
Nakaiso

(10) Patent No.: US 10,855,074 B2
(45) Date of Patent: Dec. 1, 2020

(54) FILTER COMPONENT HAVING ESD PROTECTION FUNCTION

(71) Applicant: Murata Manufacturing Co., Ltd., Nagaokakyo (JP)

(72) Inventor: Toshiyuki Nakaiso, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 230 days.

(21) Appl. No.: 16/227,070

(22) Filed: Dec. 20, 2018

(65) Prior Publication Data
US 2019/0123552 A1  Apr. 25, 2019

Related U.S. Application Data

(63) Continuation of application No. PCT/JP2017/026755, filed on Jul. 25, 2017.

(30) Foreign Application Priority Data

Aug. 1, 2016 (JP) .................. 2016-150963

(51) Int. Cl.
H02H 9/04 (2006.01)
H03H 7/01 (2006.01)
(Continued)

(52) U.S. Cl.
CPC .......... H02H 9/045 (2013.01); H01L 23/528 (2013.01); H01L 23/5223 (2013.01);
(Continued)

(58) Field of Classification Search
CPC ...... H02H 9/045; H02H 9/04; H01L 23/5223; H01L 23/5226; H01L 23/528;
(Continued)

(56) References Cited

U.S. PATENT DOCUMENTS 4,219,199 A  8/1980 Okuda
7,786,837 B2 * 8/2010 Hebert .................. H01F 27/292
336/200
(Continued)

FOREIGN PATENT DOCUMENTS

JP  S5812234 B2  3/1983
JP  S6048332 U   4/1985
(Continued)

OTHER PUBLICATIONS

Machine Translation of Ichiyanagi Japanese Patent Document JP 2007-294746 A Nov. 8, 2007 (Year: 2007).*
(Continued)

Primary Examiner — Kevin J Comber
(74) Attorney, Agent, or Firm — Arent Fox LLP

(57) ABSTRACT

A filter component having an ESD protection function that includes a mounting inductor component and a base board. An ESD protection element and a capacitor are formed in the base board, which includes a semiconductor substrate, and front and back rewiring layers. First and second mounting component connection terminal conductors to which the mounting inductor component is connected are formed on an outer surface of the front rewiring layer. Moreover, a first, second and third external connection terminal conductors are formed on an outer surface of the back rewiring layer. The ESD protection element is formed in the semiconductor substrate and the capacitor is formed in one of the front rewiring layer or the back rewiring layer.

20 Claims, 4 Drawing Sheets

(51) Int. Cl.
*H01L 23/522* (2006.01)
*H01L 23/528* (2006.01)
*H01L 27/02* (2006.01)
*H01L 49/02* (2006.01)
*H03H 1/00* (2006.01)

(52) U.S. Cl.
CPC ...... *H01L 23/5226* (2013.01); *H01L 27/0248* (2013.01); *H01L 28/40* (2013.01); *H02H 9/04* (2013.01); *H03H 7/0107* (2013.01); *H03H 7/0115* (2013.01); *H03H 2001/0064* (2013.01)

(58) Field of Classification Search
CPC ... H01L 27/0248; H01L 28/04; H03H 7/0107; H03H 7/0115; H03H 2001/0064
USPC .......................................................... 361/56
See application file for complete search history.

(56) References Cited

U.S. PATENT DOCUMENTS

| | | | |
|---|---|---|---|
| 9,136,228 | B2 | 9/2015 | Kato et al. |
| 9,444,424 | B2 | 9/2016 | Mizoguchi |
| 10,276,533 | B2 | 4/2019 | Umemoto |
| 2008/0258257 | A1* | 10/2008 | Klee ................ H01L 27/0805 257/532 |
| 2011/0038088 | A1* | 2/2011 | Noma ................ H05K 1/026 361/112 |
| 2013/0083439 | A1 | 4/2013 | Hayakawa |
| 2013/0099353 | A1 | 4/2013 | Kato et al. |
| 2014/0232481 | A1 | 8/2014 | Mizoguchi |
| 2015/0243585 | A1 | 8/2015 | Umemoto |
| 2017/0162528 | A1 | 6/2017 | Umemoto |
| 2018/0247911 | A1 | 8/2018 | Umemoto |

FOREIGN PATENT DOCUMENTS

| | | |
|---|---|---|
| JP | 2007258629 A | 10/2007 |
| JP | 2007294746 A | 11/2007 |
| JP | 2008034705 A | 2/2008 |
| JP | 2008054055 A | 3/2008 |
| JP | 2014179967 A | 9/2014 |
| JP | 2015159147 A | 9/2015 |
| WO | 2011152255 A1 | 12/2011 |
| WO | 2011152256 A1 | 12/2011 |

OTHER PUBLICATIONS

International Search Report issued in PCT/JP2017/026755, dated Oct. 24, 2017.
Written Opinion of the International Searching Authority issued in PCT/JP2017/026755, dated Oct. 24, 2017.

* cited by examiner

FILTER COMPONENT HAVING ESD PROTECTION FUNCTION

CROSS REFERENCE TO RELATED APPLICATIONS

The present application is a continuation of PCT/JP2017/026755 filed Jul. 25, 2017, which claims priority to Japanese Patent Application No. 2016-150963, filed Aug. 1, 2016, the entire contents of each of which are incorporated herein by reference.

TECHNICAL FIELD

The present disclosure relates to a filter component having an ESD protection function including a diode, an inductor, and a capacitor.

BACKGROUND

Various types of ESD protection circuits have been used to prevent damage, malfunction, and the like, of electronic devices due to electro-static discharge (ESD).

For example, Patent Document 1 (identified below) describes a radio transmitter including an ESD protection circuit disposed between an antenna terminal and transmitter and receiver circuits (hereinafter referred to together as a transmitter/receiver circuit). This conventional ESD protection circuit has a filter function in addition to an ESD protection function.

Moreover, the conventional ESD protection circuit includes an inductor, a varistor, and a capacitor. The inductor is connected between the transmitter/receiver circuit and the antenna terminal. The varistor is connected between one terminal of the inductor and the ground. The capacitor is connected parallel to the inductor between the other terminal of the inductor and the ground.

In the ESD protection circuit having the above-described circuit structure, the inductor, the varistor, and the capacitor are individual mounting components. The inductor, the varistor, and the capacitor are individually mounted on a base circuit board (printed circuit board).

Patent Document 1: Japanese Unexamined Patent Application Publication No. 2008-54055.

In the structure of the ESD protection circuit according to the related art, circuit elements are individual mounting components, and are mounted on the base circuit board. Therefore, the ESD protection circuit occupies a large space. In addition, since the inductor, the varistor, and the capacitor are connected by wiring conductors on the base circuit board, there is a risk that the desired characteristics of a filter circuit, for example, cannot be obtained.

SUMMARY OF THE INVENTION

Accordingly, an object of the present disclosure is to provide a small filter component having an ESD protection function with desired characteristics.

Thus, a filter component having an ESD protection function according to an exemplary embodiment is disclosed that has a circuit structure including an inductor connected between a first terminal and a second terminal, an ESD protection element connected between the first terminal and a ground terminal, and a capacitor connected between the second terminal and the ground terminal. The filter component having an ESD protection function includes a mounting inductor component and a base board. Moreover, the mounting inductor component includes a magnetic material in which an inductor conductor pattern is formed, the inductor being formed of the inductor conductor pattern. The ESD protection element and the capacitor are formed in the base board. The base board includes a semiconductor substrate in which the ESD protection element is formed, a front rewiring layer formed on a front surface of the semiconductor substrate, and a back rewiring layer formed on a back surface of the semiconductor substrate. A first mounting component connection terminal conductor and a second mounting component connection terminal conductor, to which the mounting inductor component is connected, are formed on an outer surface of the front rewiring layer. A first external connection terminal conductor that constitutes the first terminal, a second external connection terminal conductor that constitutes the second terminal, and a third external connection terminal conductor that constitutes the ground terminal are formed on an outer surface of the back rewiring layer. The capacitor is formed in the front rewiring layer or the back rewiring layer.

In the structure of the exemplary embodiment, the mounting inductor component is placed on the base board in which the ESD protection element and the capacitor are formed, and is connected to the base board. Accordingly, space can be saved and the distances between the inductor, the ESD protection element, and the capacitor can be reduced so that unnecessary wires can be omitted.

In addition, the filter component having an ESD protection function according to the exemplary embodiment can have a structure in which the ESD protection element is formed at the front surface of the semiconductor substrate, and the capacitor id formed in the back rewiring layer.

In this structure, the semiconductor substrate is interposed between the ESD protection element and the capacitor. Therefore, electrical coupling between the ESD protection element and the capacitor can be reduced. In addition, the distance between the capacitor and the ground is reduced, so that the parasitic inductance between the capacitor and the ground is reduced.

In another exemplary embodiment, the filter component having an ESD protection function can have a structure in which the ESD protection element is formed at the back surface of the semiconductor substrate, and the capacitor is formed in the front rewiring layer.

In this structure, the semiconductor substrate is interposed between the ESD protection element and the capacitor. Therefore, electrical coupling between the ESD protection element and the capacitor can be reduced. In addition, the distance between the ESD protection element and the ground is reduced, so that the parasitic inductance between the ESD protection element and the ground is reduced.

In another exemplary embodiment, the capacitor is preferably a metal-insulator-metal (MIM) capacitor that is in contact with the semiconductor substrate and in which ferroelectric bodies and planar conductors are alternately arranged and laminated together.

With this structure, a thin high-capacitance capacitor can be realized.

In another exemplary embodiment, the ESD protection element can be formed at the front surface of the semiconductor substrate, and the capacitor may be formed in the front rewiring layer.

In this structure, the distances from the ESD protection element and the capacitor to the inductor are reduced, and the parasitic inductance in this region is reduced.

In another exemplary embodiment, the ESD protection element is formed at the back surface of the semiconductor substrate, and the capacitor may be formed in the back rewiring layer.

In this structure, the distances from the ESD protection element and the capacitor to the ground are reduced, and the parasitic inductance in this region is reduced.

In another exemplary embodiment, the capacitor preferably includes a plurality of planar conductors that face each other and an inorganic layer disposed between the planar conductors.

With this structure, loss due to the capacitor is less than that in the case where a resin layer is disposed between the planar conductors.

In another exemplary embodiment, the back rewiring layer preferably includes a resin layer.

With this structure, an impact generated when the filter component having an ESD protection function is mounted on an external circuit is reduced by the back rewiring layer.

In another exemplary embodiment, the front rewiring layer preferably includes a resin layer.

With this structure, an impact generated when the mounting inductor component is mounted on the base board is reduced by the front rewiring layer.

According to the exemplary embodiments of the present disclosure, a small filter component having an ESD protection function with desired characteristics is provided as will be described in detail below.

DETAILED DESCRIPTION OF EMBODIMENTS

Figure 1A:
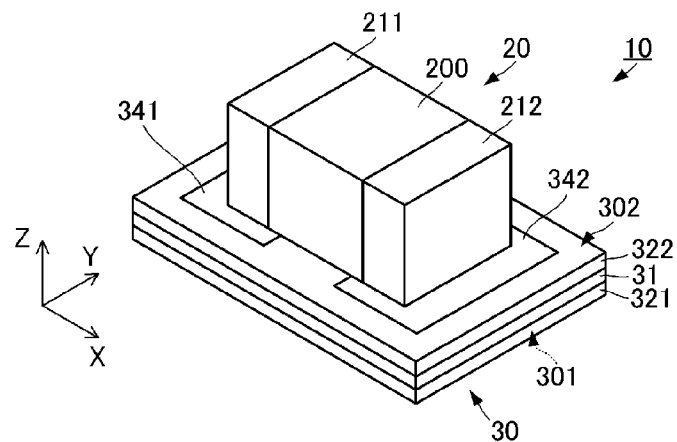
FIG. 1(A) is an external perspective view of a filter component having an ESD protection function according to a first embodiment.
Figure 1B:
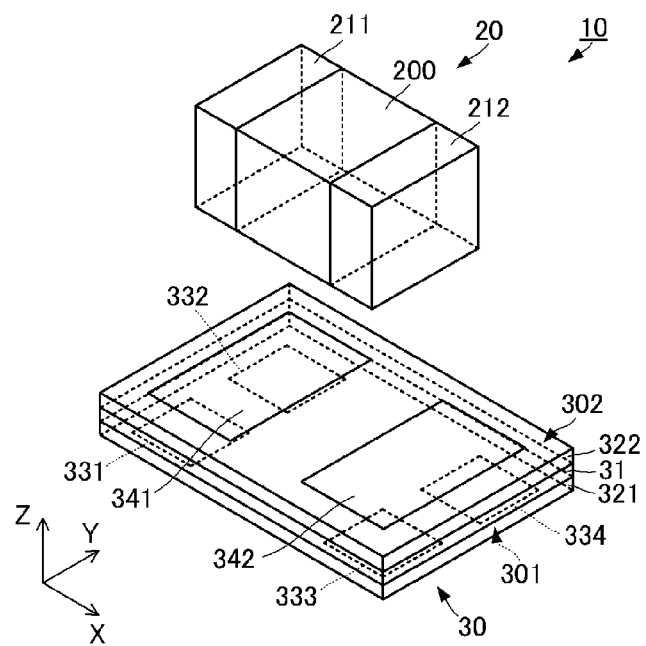
FIG. 1(B) is an exploded perspective view of the filter component having an ESD protection function.
Figure 2A:
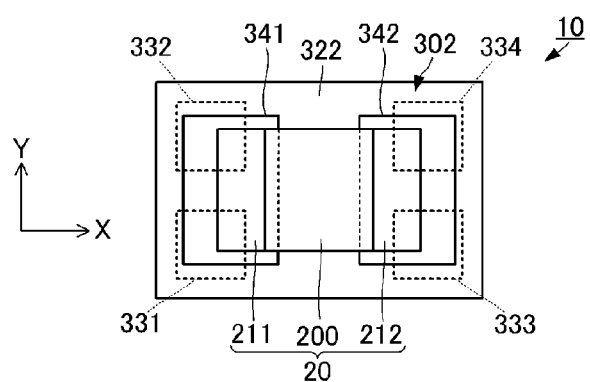
FIG. 2(A) is a front view of the filter component having an ESD protection function according to the first embodiment.
Figure 2B:
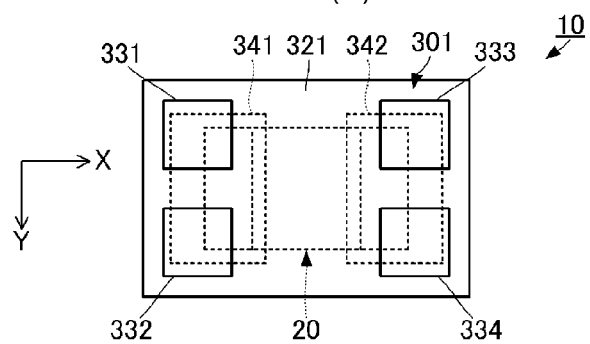
FIG. 2(B) is a back view of the filter component having an ESD protection function according to the first embodiment.
Figure 3A:
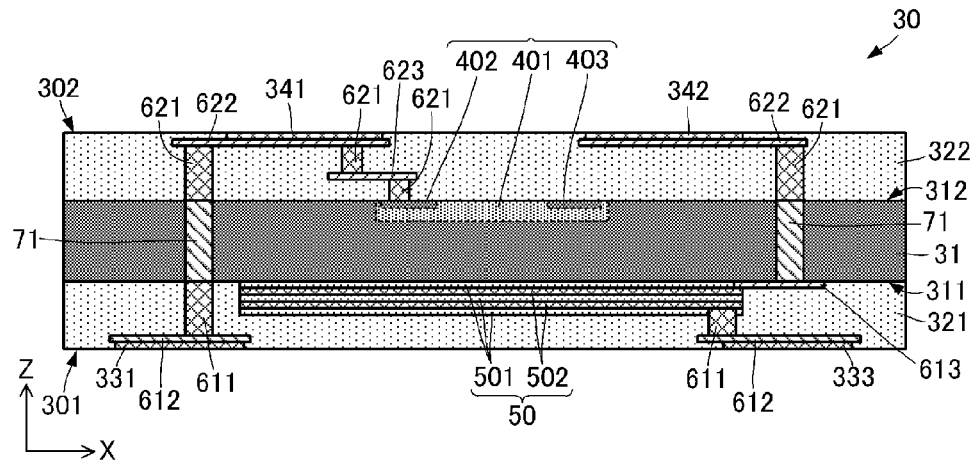
FIG. 3(A) is a sectional view illustrating the structure of a base board according to the first embodiment.
Figure 3B:
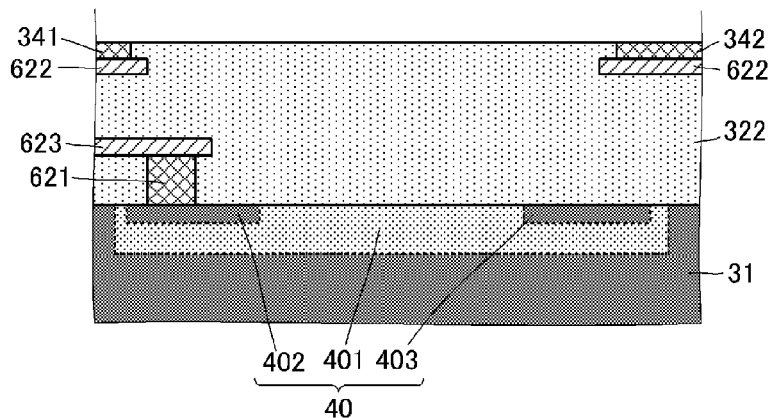
FIG. 3(B) is an enlarged sectional view of a portion of the base board including the ESD protection element.
Figure 4:
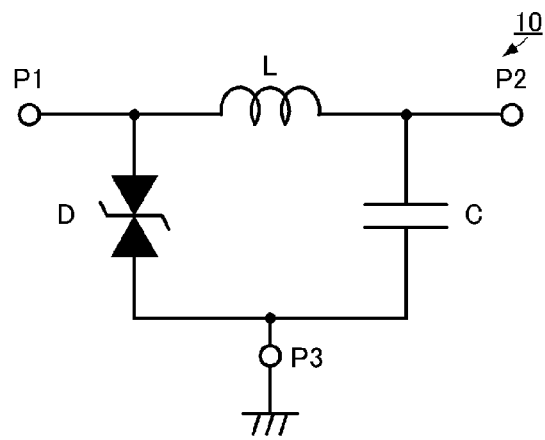
FIG. 4 is an equivalent circuit diagram of the filter component having an ESD protection function according to the first embodiment.

A filter component having an ESD protection function according to a first exemplary embodiment will now be described with reference to the drawings. FIG. 1(A) is an external perspective view of the filter component having an ESD protection function according to the first embodiment, and FIG. 1(B) is an exploded perspective view of the filter component having an ESD protection function according to the first embodiment. FIG. 2(A) is a front view of the filter component having an ESD protection function according to the first embodiment, and FIG. 2(B) is a back view of the filter component having an ESD protection function according to the first embodiment. FIG. 3(A) is a sectional view illustrating the structure of a base board according to the first embodiment, and FIG. 3(B) is an enlarged sectional view of a portion of the base board including the ESD protection element. FIG. 4 is an equivalent circuit diagram of the filter component having an ESD protection function according to the first embodiment. In the following description, the filter component having an ESD protection function is referred to simply as a "filter component".

The circuit structure of the filter component according to the present embodiment will now be described with reference to FIG. 4. As shown, filter component 10 includes a first terminal P1, a second terminal P2, and a third terminal P3. For purposes of this disclosure, the third terminal P3 is a terminal connected to the ground, and corresponds to a "ground terminal" and the filter component 10 includes an inductor L, a diode D, and a capacitor C, wherein diode D corresponds to an "ESD protection element".

As further shown, the inductor L is connected between the first terminal P1 and the second terminal P2. The diode D is connected between the first terminal P1 and the third terminal P3. Moreover, the capacitor C is connected between the second terminal P2 and the third terminal P3.

According to this structure, when a surge current is input to the first terminal P1, the filter component 10 outputs the surge current to the third terminal P3 through the diode D so that the surge current flows to the ground. Thus, the filter component 10 provides the ESD protection function. The filter component 10 also includes the inductor L, which is series connected between the first terminal P1 and the second terminal P2, and the capacitor C, which is shunt connected between the first terminal P1 and the second terminal P2. Accordingly, the filter component 10 provides a function of a low pass filter having an attenuation pole determined by the inductance of the inductor L and the capacitance of the capacitor C. Since the diode D has a parasitic capacitor, the filter characteristics of the low pass filter may be determined by using the capacitance of the parasitic capacitor.

Thus, the filter component 10 has both the ESD protection function and the function of a low pass filter.

The structure of the filter component 10 will now be described with reference to FIGS. 1(A), 1(B), 2(A), 2(B), 3(A), and 3(B).

The filter component 10 includes a mounting inductor component 20 and a base board 30. The mounting inductor component 20 is mounted on a front surface 302 of the base board 30.

The mounting inductor component 20 includes an element body 200, an external conductor 211, and an external conductor 212. The element body 200 has predetermined dimensions in the directions of three orthogonal axes (X direction, Y direction, and Z direction). For example, (dimension in X direction)×(dimension in Y direction) is about 1.0 [mm]×0.5 [mm] or about 0.6 [mm]×0.3 [mm]. The dimension in the Z direction is substantially equal to the dimension in the Y direction. Although not illustrated, a helical inductor conductor having a winding axis extending in the Z direction is formed in the element body 200.

The external conductor 211 is formed on a first end portion of the element body 200 in the X direction. The external conductor 211 is connected to one end of the inductor conductor in the element body 200. The external conductor 212 is formed on a second end portion of the element body 200 in the X direction. The external conductor 212 is connected to the other end of the inductor conductor in the element body 200. The external conductor 211 is located so as to overlap at least a first mounting component connection terminal conductor 341 in front view of the base board 30. The external conductor 212 is located so as to overlap at least a second mounting component connection terminal conductor 342 in front view of the base board 30. The external conductor 212 and the external conductor 211 are apart from each other.

The base board 30 includes a semiconductor substrate 31, a back rewiring layer 321, and a front rewiring layer 322. The back rewiring layer 321 is formed on a first surface 311 of the semiconductor substrate 31, and the front rewiring layer 322 is formed on a second surface 312 of the semiconductor substrate 31. The dimension of the base board 30 in the X direction is slightly greater than the dimension of the mounting inductor component 20 in the X direction, and the dimension of the base board 30 in the Y direction is slightly greater than the dimension of the mounting inductor component 20 in the Y direction. The differences in the dimensions may be set as appropriate. For example, the dimension of the base board 30 in the X direction may be greater than the dimension of the mounting inductor component 20 in the X direction by about 0.1 [mm], and the dimension of the base board 30 in the Y direction may be greater than the dimension of the mounting inductor component 20 in the Y direction by about 0.1 mm. The dimension (thickness) of the base board 30 in the Z direction is less than the dimension of the mounting inductor component 20 in the Z direction, and may be, for example, about 0.05-0.1 [mm].

According to the exemplary embodiment, a first external connection terminal conductor 331, a second external connection terminal conductor 332, a third external connection terminal conductor 333, and a dummy terminal conductor 334 are formed on an outer surface of the back rewiring layer 321, that is, on a surface of the back rewiring layer 321 that faces away from the semiconductor substrate 31 or a back surface 301 of the base board 30. The first external connection terminal conductor 331, the second external connection terminal conductor 332, the third external connection terminal conductor 333, and the dummy terminal conductor 334 are formed on four corners of the back surface 301.

More specifically, according to the exemplary aspect as shown, the first external connection terminal conductor 331 is formed on the corner of the back surface 301 at one end in the X direction and one end in the Y direction. The second external connection terminal conductor 332 is formed on the corner of the back surface 301 at the one end in the X direction and the other end in the Y direction. The third external connection terminal conductor 333 is formed on the corner of the back surface 301 at the other end in the X direction and the one end in the Y direction. The dummy terminal conductor 334 is formed on the corner of the back surface 301 at the other end in the X direction and the other end in the Y direction.

The first mounting component connection terminal conductor 341 and the second mounting component connection terminal conductor 342 are formed on an outer surface of the front rewiring layer 322, that is, a surface of the front rewiring layer 322 that faces away from the semiconductor substrate 31 or the front surface 302 of the base board 30.

More specifically, the first mounting component connection terminal conductor 341 is formed near one end of the front surface 302 in the X direction. The first mounting component connection terminal conductor 341 preferably overlaps the first external connection terminal conductor 331 and the second external connection terminal conductor 332 in front view of the base board 30. In such a case, the area of the base board 30 can be reduced.

The second mounting component connection terminal conductor 342 is formed near the other end of the front surface 302 in the X direction (i.e., opposite the one end noted above). The second mounting component connection terminal conductor 342 preferably overlaps the third external connection terminal conductor 333 and the dummy terminal conductor 334 in front view of the base board 30. In such a case, the area of the base board 30 can be reduced.

The external conductor 211 of the mounting inductor component 20 is connected to the first mounting component connection terminal conductor 341, and the external conductor 212 of the mounting inductor component 20 is connected to the second mounting component connection terminal conductor 342. Although not illustrated, these connections are achieved by using, for example, a joining material such as solder.

The internal structure of the base board 30 will now be described in more detail.

Specifically, the semiconductor substrate 31 is made of, for example, Si (silicon). An ESD protection element 40 is formed in the semiconductor substrate 31. The ESD protection element 40 is formed at the second surface 312 of the semiconductor substrate 31 in a region that is exposed at the second surface 312 and has a predetermined depth into the substrate 31. In particular, the ESD protection element 40 includes an n-type semiconductor layer (n-type well) 401 and two p-type semiconductor portions 402 and 403. The n-type semiconductor layer 401 is formed at the front surface of the semiconductor substrate 31 and has a predetermined depth. The two p-type semiconductor portions 402 and 403 are formed in the n-type semiconductor layer 401 and are apart from each other. The two p-type semiconductor portions 402 and 403 are exposed at the second surface 312 of the semiconductor substrate 31. The exposed portions of the two p-type semiconductor portions 402 and 403 serve as input/output terminals of the ESD protection element 40. With this structure, a diode including two pn junctions whose cathodes are connected to each other and whose anodes are exposed at the second surface 312 of the semiconductor substrate 31 is formed. Thus, the ESD protection element 40 provides the ESD protection function.

The back rewiring layer 321 and the front rewiring layer 322 are composed of resin layers. Moreover, a capacitor 50 is disposed in the back rewiring layer 321. The capacitor 50 includes a plurality of ferroelectric layers 501 and a plurality of planar conductors 502. The ferroelectric layers 501 and the planar conductors 502 extend in the X and Y directions. The ferroelectric layers 501 are made of, for example, BST. The ferroelectric layers 501 and the planar conductors 502 are alternately arranged in the Z direction and laminated together. Thus, the capacitor 50 is a metal-insulator-metal (MIM) capacitor. Owing to this structure, the capacitor 50 is thin and has a large capacitance.

The back rewiring layer 321 also includes wiring conductors 611, 612, and 613. The wiring conductors 611 are conductors that extend in the Z direction, such as so-called contact holes. The wiring conductors 612 and 613 are conductors that extend in the X direction or the Y direction.

The front rewiring layer 322 includes wiring conductors 621, 622, and 623. The wiring conductors 621 are conductors that extend in the Z direction, such as so-called contact holes. The wiring conductors 622 and 623 are conductors that extend in the X direction or the Y direction.

The semiconductor substrate 31 includes through via conductors 71 at positions other than the position at which the ESD protection element 40 is formed. The through via conductors 71 are conductors that extend through the semiconductor substrate 31 between the first surface 311 and the second surface 312.

One end of the ESD protection element 40 (e.g., p-type semiconductor portion 402) is connected to the first mounting component connection terminal conductor 341 by predetermined wiring conductors 621, 623, and 622 in the front rewiring layer 322. Although not illustrated, the other end of the ESD protection element 40 (e.g., p-type semiconductor portion 403) is connected to the third external connection terminal conductor 333.

The first mounting component connection terminal conductor 341 is connected to the first external connection terminal conductor 331 by predetermined wiring conductors 622 and 621 in the front rewiring layer 322, a predetermined through via conductor 71 in the semiconductor substrate 31, and predetermined wiring conductors 611 and 612 in the back rewiring layer 321. Instead of using the through via conductor 71, a conductive pattern (i.e., a side conductor) can be formed on a side surface of the semiconductor substrate 31 and used to connect the conductors in the back rewiring layer 321 to the conductors in the front rewiring layer 322.

The planar conductor 502 at one end of the capacitor 50 is connected to the third external connection terminal conductor 333 by predetermined wiring conductors 611 and 612 in the back rewiring layer 321. The planar conductor 502 at the other end of the capacitor 50 is connected to the second mounting component connection terminal conductor 342 by a predetermined wiring conductor 613 in the back rewiring layer 321, a predetermined through via conductor 71 in the semiconductor substrate 31, and predetermined wiring conductors 621 and 622 in the front rewiring layer 322.

Although not illustrated, in the exemplary aspect, the second mounting component connection terminal conductor 342 is connected to the second external connection terminal conductor 332.

It should be appreciated that the circuit structure illustrated in FIG. 4 is formed by the above-described connection structure.

In the structure illustrated in FIG. 3, the ESD protection element 40 is disposed at the front surface of the semiconductor substrate 31, and the capacitor 50 is disposed in the back rewiring layer 321. Thus, the semiconductor substrate 31 is provided between the ESD protection element 40 and the capacitor 50. Therefore, coupling between the ESD protection element 40 and the capacitor 50 is reduced.

The capacitor 50 is connected to the third external connection terminal conductor 333 only by the wiring conductors in the back rewiring layer 321. Accordingly, the parasitic inductance between the capacitor 50 and the ground can be reduced.

The ESD protection element 40 is connected to the mounting inductor component 20 only by the wiring conductors in the front rewiring layer 322. Accordingly, the parasitic inductance between the ESD protection element 40 and the mounting inductor component 20 can be reduced.

Thus, by using the structure according to the present embodiment, unnecessary inductance and coupling in the filter component 10 can be reduced, and the desired filter characteristics can be easily obtained. Thus, a filter component 10 having an ESD protection function and good filter characteristics can be easily provided.

In addition, since the mounting inductor component 20 is mounted on the front surface 302 of the base board 30, the filter component 10 is small in size.

In the filter component 10, the front rewiring layer 322 is a resin layer. Therefore, an impact generated when the mounting inductor component 20 is mounted on the base board 30 can be reduced. In addition, in the filter component 10, the back rewiring layer 321 is also a resin layer. Therefore, an impact generated when the filter component 10 is mounted on an external circuit board can be reduced by the back rewiring layer 321. Thus, the filter component 10 is highly shock resistant.

In the filter component 10, the mounting inductor component 20 in which the inductor L is formed and the base board 30 in which the diode D that serves as the ESD protection element and the capacitor C are formed are separate components. Therefore, even when the mounting inductor component 20 is formed of a magnetic material and the base board 30 is formed of a semiconductor and a resin, each component shows high reliability. An inductor formed of a magnetic material cannot be easily integrated with a base board, and the reliability thereof is reduced. Such a problem can be solved by the structure of the present embodiment.

In addition, since the diode D formed in the semiconductor substrate 31 serves as the ESD protection element, a problem that a discharge voltage is difficult to control and is easily increased, which occurs when the ESD protection element is a hollow gap formed in a dielectric substrate, can also be solved.

Figure 5:
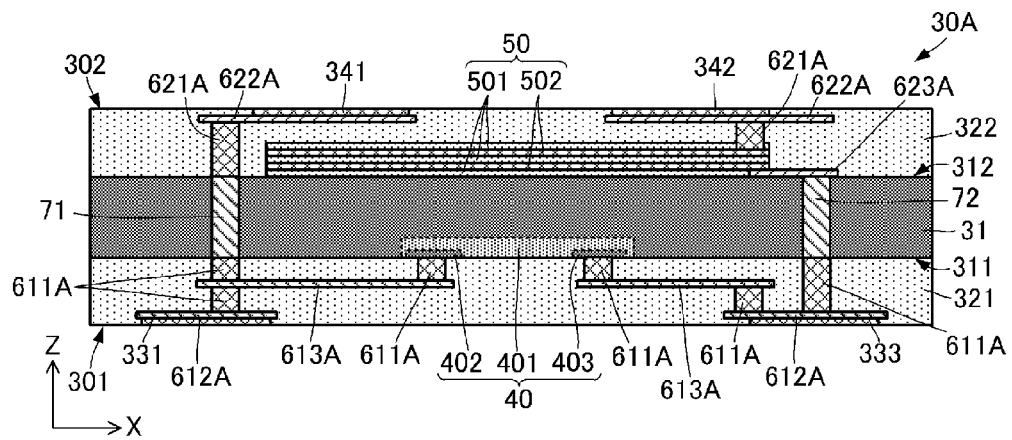
FIG. 5 is a sectional view illustrating the structure of a base board according to a second embodiment.

A filter component having an ESD protection function according to a second embodiment will now be described with reference to the drawings. FIG. 5 is a sectional view illustrating the structure of a base board according to the second embodiment.

In this aspect, the filter component having an ESD protection function according to the present embodiment includes a base board 30A having a structure different from that in the filter component 10 having an ESD protection function according to the first embodiment. Other structures of the filter component having an ESD protection function according to the present embodiment are the same as those of the filter component 10 having an ESD protection function according to the first embodiment. Description of similar portions is omitted.

The base board 30A basically differs from the base board 30 according to the first embodiment in the arrangement of the ESD protection element 40 and the capacitor 50. The first external connection terminal conductor 331, the second external connection terminal conductor 332, the first mounting component connection terminal conductor 341, and the second mounting component connection terminal conductor 342 of the base board 30A are similar to those of the base board 30 according to the first embodiment.

The ESD protection element 40 is formed at the first surface 311 (back surface) of the semiconductor substrate 31. The capacitor 50 is formed in the front rewiring layer 322 at a side facing the second surface 312 of the semiconductor substrate 31. Thus, the semiconductor substrate 31 is interposed between the ESD protection element 40 and the capacitor 50. Accordingly, coupling between the ESD protection element 40 and the capacitor 50 is reduced.

The p-type semiconductor portion 402 of the ESD protection element 40 is connected to the first external connection terminal conductor 331 by predetermined wiring conductors 611A, 613A, and 612A in the back rewiring layer 321. Thus, the ESD protection element 40 is connected to the first external connection terminal conductor 331 only by the wiring conductors in the back rewiring layer 321. Accordingly, the parasitic inductor between the ESD protection element 40 and the first external connection terminal conductor 331 (first terminal P1) can be reduced. The p-type semiconductor portion 402 is also connected to the first mounting component connection terminal conductor 341 by predetermined wiring conductors 611A and 613A in the back rewiring layer 321, a predetermined through via conductor 71 in the semiconductor substrate 31, and predetermined wiring conductors 621A and 622A in the front rewiring layer 322.

The p-type semiconductor portion 403 of the ESD protection element 40 is connected to the third external connection terminal conductor 333 by predetermined wiring conductors 611A, 613A, and 612A in the back rewiring layer 321. Thus, the ESD protection element 40 is connected to the third external connection terminal conductor 333 only by the wiring conductors in the back rewiring layer 321. Accordingly, the parasitic inductor between the ESD protection element 40 and the third external connection terminal conductor 333 (third terminal P3: ground connection terminal) can be reduced.

The planar conductor 502 at one end of the capacitor 50 is connected to the second mounting component connection terminal conductor 342 by predetermined wiring conductors 621A and 622A in the front rewiring layer 322. Accordingly, the parasitic inductor between the capacitor 50 and the mounting inductor component 20 can be reduced. The planar conductor 502 at the other end of the capacitor 50 is connected to the third external connection terminal conductor 333 by a wiring conductor 623A in the front rewiring layer 322, a predetermined through via conductor 71 in the semiconductor substrate 31, and predetermined wiring conductors 611A and 612A in the back rewiring layer 321.

Also in this structure, similar to the first embodiment, unnecessary inductance and coupling can be reduced, and the desired filter characteristics can be easily obtained. Thus, a filter component having an ESD protection function and good filter characteristics can be easily provided.

Figure 6:
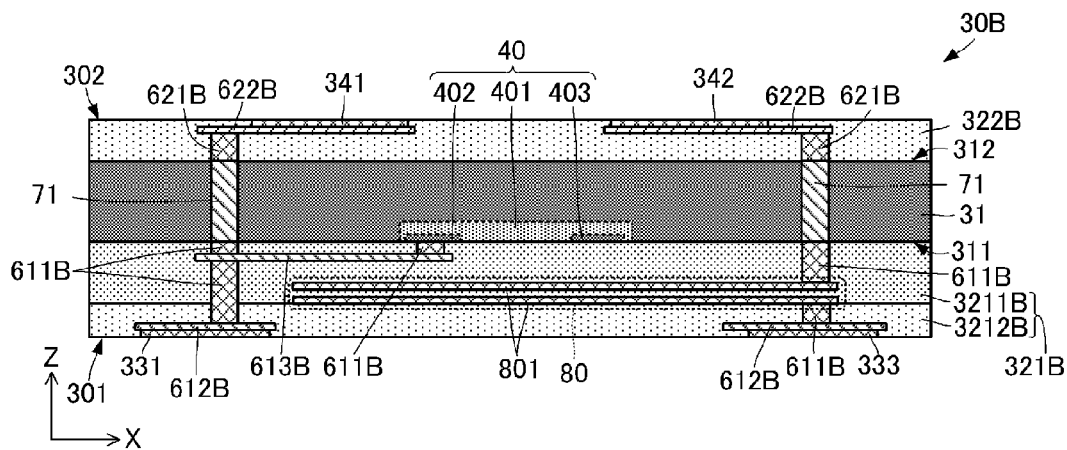
FIG. 6 is a sectional view illustrating the structure of a base board according to a third embodiment.

A filter component having an ESD protection function according to a third embodiment will now be described with reference to the drawings. FIG. 6 is a sectional view illustrating the structure of a base board according to the third embodiment.

The filter component having an ESD protection function according to the present embodiment includes a base board 30B having a structure different from that in the filter component having an ESD protection function according to the second embodiment. Other structures of the filter component having an ESD protection function according to the present embodiment are the same as those of the filter component having an ESD protection function according to the second embodiment. Description of similar portions is omitted.

The base board 30B differs from the base board 30A according to the second embodiment in the structures of a back rewiring layer 321B and a capacitor 80.

The base board 30B includes the semiconductor substrate 31, the back rewiring layer 321B, and a front rewiring layer 322B. The back rewiring layer 321B includes a rewiring layer 3211B and a rewiring layer 3212B that are laminated together. The rewiring layer 3211B is in contact with the first surface 311 of the semiconductor substrate 31. The rewiring layer 3212B is in contact with the rewiring layer 3211B and defines the back surface of the base board 30B.

The rewiring layer 3212B is composed of an inorganic material, such as $SiO_2$, and the rewiring layer 3211B is composed of a resin layer.

The capacitor 80 is formed of a plurality of planar conductors 801 (two planar conductors 801 in FIG. 6) and portions of the rewiring layer 3211B disposed between the planar conductors 801. When the capacitor 80 is formed in the rewiring layer 3211B, loss is less than that in the case where the capacitor is formed in the rewiring layer 3212B composed of a resin layer.

According to the above-described structure, a shock resistant, low loss capacitor can be formed in the rewiring layer 3211B.

The planar conductor 801 at one end of the capacitor 80 is connected to the third external connection terminal conductor 333 by predetermined wiring conductors 611B and 612B in the rewiring layer 3212B. Accordingly, the parasitic inductor between the capacitor 80 and the third external connection terminal conductor 333 (third terminal P3: ground connection terminal) can be reduced. The planar conductor 801 at the other end of the capacitor 80 is connected to the second mounting component connection terminal conductor 342 by a wiring conductor 611B in the rewiring layer 3211C, a predetermined through via conductor 71 in the semiconductor substrate 31, and predetermined wiring conductors 621B and 622B in the front rewiring layer 322B.

The p-type semiconductor portion 402 of the ESD protection element 40 is connected to the first external connection terminal conductor 331 by predetermined wiring conductors 611B, 613B, and 612B in the back rewiring layer 321B. Thus, the ESD protection element 40 is connected to the first external connection terminal conductor 331 only by the wiring conductors in the back rewiring layer 321B. Accordingly, the parasitic inductor between the ESD protection element 40 and the first external connection terminal conductor 331 (first terminal P1) can be reduced. The p-type semiconductor portion 402 is also connected to the first mounting component connection terminal conductor 341 by predetermined wiring conductors 611B and 613B in the back rewiring layer 321B, a predetermined through via conductor 71 in the semiconductor substrate 31, and predetermined wiring conductors 621B and 622B in the front rewiring layer 322B.

The p-type semiconductor portion 403 of the ESD protection element 40 is connected to the third external connection terminal conductor 333 by predetermined wiring conductors (not shown) in the back rewiring layer 321B. Thus, the ESD protection element 40 is connected to the third external connection terminal conductor 333 only by the wiring conductors in the back rewiring layer 321B. Accordingly, the parasitic inductor between the ESD protection element 40 and the third external connection terminal conductor 333 (i.e., third terminal P3: ground connection terminal) can be reduced.

Also in this structure, similar to the above-described embodiments, unnecessary inductance and coupling can be reduced, and the desired filter characteristics can be easily obtained. Thus, a filter component having an ESD protection function and good filter characteristics can be easily provided.

Figure 7:
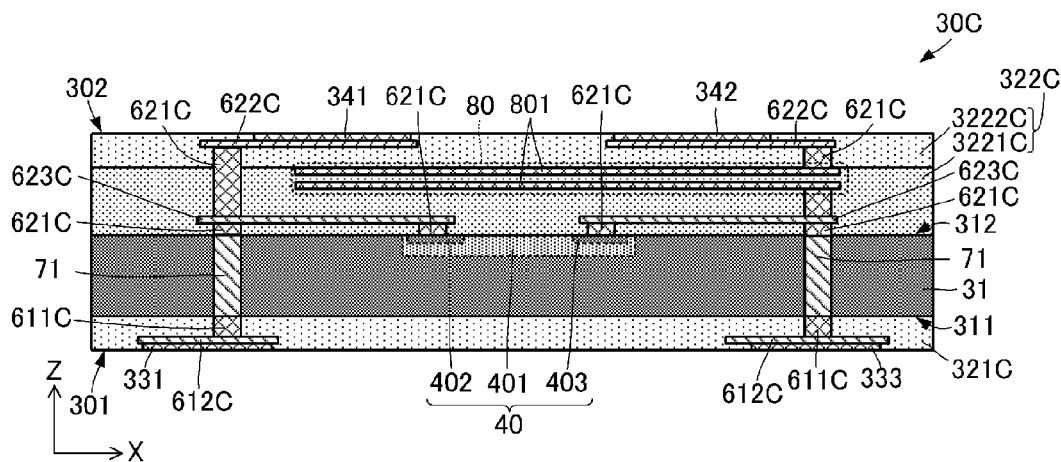
FIG. 7 is a sectional view illustrating the structure of a base board according to a fourth embodiment.

A filter component having an ESD protection function according to a fourth embodiment will now be described with reference to the drawings. FIG. 7 is a sectional view illustrating the structure of a base board according to the fourth embodiment.

The filter component having an ESD protection function according to the present embodiment includes a base board 30C having a structure different from that in the filter component 10 having an ESD protection function according to the first embodiment. Other structures of the filter component having an ESD protection function according to the present embodiment are the same as those of the filter component having an ESD protection function according to the first embodiment. Description of similar portions is omitted.

The base board 30C differs from the base board 30 according to the first embodiment in the structures of a front rewiring layer 322C and a capacitor 80.

The base board 30C includes the semiconductor substrate 31, the back rewiring layer 321C, and a front rewiring layer 322C. The front rewiring layer 322C includes a rewiring layer 3221C and a rewiring layer 3222C that are laminated together. The rewiring layer 3221C is in contact with the second surface 312 of the semiconductor substrate 31. The rewiring layer 3222C is in contact with the rewiring layer 3221C and defines the front surface of the base board 30C.

The rewiring layer 3221C is composed of an inorganic material, such as $SiO_2$, and the rewiring layer 3222C is composed of a resin layer.

The capacitor 80 is formed of a plurality of planar conductors 801 (two planar conductors 801 in FIG. 7) and a portion of the rewiring layer 3221C disposed between the planar conductors 801. When the capacitor 80 is formed in the rewiring layer 3221C, loss is less than that in the case where the capacitor is formed in the rewiring layer 3222C composed of a resin layer.

According to the above-described structure, a shock resistant, low loss capacitor can be formed in the rewiring layer 3221C.

The planar conductor 801 at one end of the capacitor 80 is connected to the second mounting component connection terminal conductor 342 by predetermined wiring conductors 621C and 622C in the rewiring layer 3222C. Accordingly, the parasitic inductor between the capacitor 50 and the mounting inductor component 20 can be reduced. The planar conductor 801 at the other end of the capacitor 80 is connected to the third external connection terminal conductor 333 by wiring conductors 621C in the rewiring layer 3221C, a predetermined through via conductor 71 in the semiconductor substrate 31, and predetermined wiring conductors 611C and 612C in the back rewiring layer 321C.

The p-type semiconductor portion 402 of the ESD protection element 40 is connected to the first mounting component connection terminal conductor 341 by predetermined wiring conductors 621C, 623C, and 622C in the front rewiring layer 322C. Thus, the ESD protection element 40 is connected to the first mounting component connection terminal conductor 341 only by the wiring conductors in the front rewiring layer 322C. Accordingly, the parasitic inductor between the ESD protection element 40 and the mounting inductor component 20 can be reduced. The p-type semiconductor portion 402 is also connected to the first external connection terminal conductor 331 by predetermined wiring conductors 621C and 623C in the front rewiring layer 322C, a predetermined through via conductor 71 in the semiconductor substrate 31, and predetermined wiring conductors 611C and 612C in the back rewiring layer 321C. The p-type semiconductor portion 403 is connected to the third external connection terminal conductor 333 by predetermined wiring conductors 621C and 623C in the front rewiring layer 322C, a predetermined through via conductor 71 in the semiconductor substrate 31, and predetermined wiring conductors 611C and 612C in the back rewiring layer 321C.

Also in this structure, similar to the above-described embodiments, unnecessary inductance and coupling can be reduced, and the desired filter characteristics can be easily obtained. Thus, a filter component having an ESD protection function and good filter characteristics can be easily provided.

Although the above-described embodiments are examples of preferred embodiments of the present invention, the present invention is not limited to the above-described embodiments, and various modifications are possible without changing the gist of the present invention.

REFERENCE SIGNS LIST

10: filter component
20: mounting inductor component
30, 30A, 30B, 30C: base board
31: semiconductor substrate
40: ESD protection element
50: capacitor
71: through via conductor
80: capacitor
200: element body
211, 212: external conductor
301: back surface
302: front surface
311: first surface
312: second surface
321, 321B, 321C: back rewiring layer
322, 322B, 322C: front rewiring layer
331: first external connection terminal conductor
332: second external connection terminal conductor
333: third external connection terminal conductor
334: dummy terminal conductor
341: first mounting component connection terminal conductor
342: second mounting component connection terminal conductor
401: n-type semiconductor layer
402: p-type semiconductor portion
403: p-type semiconductor portion
501: ferroelectric layer
502: planar conductor
611, 611A, 611B, 611C, 612, 613, 621, 621A, 621B, 621C, 622, 623A: wiring conductor
801: planar conductor
3211B, 3212B, 3221C, 3222C: rewiring layer
C: capacitor
D: diode
ESD: electro-static discharge
L: inductor
P1: first terminal
P2: second terminal
P3: third terminal

The invention claimed is:

1. A filter component having an ESD protection function, comprising:
an inductor connected between a first terminal and a second terminal;
an ESD protection element connected between the first terminal and a ground terminal; and
a capacitor connected between the second terminal and the ground terminal, wherein the filter component comprises a mounting inductor component that includes an inductor conductor pattern disposed in a magnetic material and forming the inductor, and wherein the ESD protection element and the capacitor are disposed in a base board that includes:
- a semiconductor substrate with the ESD protection element formed therein,
- a front rewiring layer disposed on a first surface of the semiconductor substrate, and
- a back rewiring layer disposed on a second surface of the semiconductor substrate that opposes the first surface, wherein the mounting inductor component is connected to first and second mounting component connection terminal conductors disposed on an outer surface of the front rewiring layer, wherein the first terminal, the second terminal, and the ground terminal are disposed on an outer surface of the back rewiring layer, and wherein the capacitor is formed in one of the front rewiring layer and the back rewiring layer.

2. The filter component according to claim 1, wherein the ESD protection element is formed at the first surface of the semiconductor substrate, and the capacitor is formed in the back rewiring layer.

3. The filter component according to claim 2, wherein the capacitor is an MIM capacitor in contact with the semiconductor substrate and has a plurality of ferroelectric bodies and planar conductors that are alternately arranged relative to each other and laminated together.

4. The filter component according to claim 2, wherein the ESD protection element is coupled to the first terminal by a first via conductor extending through the semiconductor substrate.

5. The filter component according to claim 4, wherein the capacitor is coupled to the second mounting component connection terminal conductor by a second first via conductor extending through the semiconductor substrate.

6. The filter component according to claim 1, wherein the ESD protection element is formed at the second surface of the semiconductor substrate, and the capacitor is formed in the front rewiring layer.

7. The filter component according to claim 6, wherein the capacitor is an MIM capacitor in contact with the semiconductor substrate and has a plurality of ferroelectric bodies and planar conductors that are alternately arranged relative to each other and laminated together.

8. The filter component according to claim 1, wherein the ESD protection element is formed at the first surface of the semiconductor substrate, and the capacitor is formed in the front rewiring layer.

9. The filter component according to claim 8, wherein the capacitor includes a plurality of planar conductors that face each other with at least one inorganic layer disposed therebetween.

10. The filter component according to claim 1, wherein the ESD protection element is formed at the second surface of the semiconductor substrate, and the capacitor is formed in the back rewiring layer.

11. The filter component according to claim 10, wherein the capacitor includes a plurality of planar conductors that face each other with at least one inorganic layer disposed therebetween.

12. The filter component according to claim 1, wherein each of the front and back rewiring layers include a resin layer.

13. A filter component having an ESD protection function, comprising:
- a mounting inductor component that includes an inductor; and
- a base board that includes:
    - a semiconductor substrate with an ESD protection element formed therein,
    - a first rewiring layer disposed on a first surface of the semiconductor substrate and having first and second mounting component connection terminal conductors disposed on an outer surface thereof and connected to the mounting inductor component,
    - a second rewiring layer disposed on a second surface of the semiconductor substrate that opposes the first surface, the second rewiring layer having a first terminal, a second terminal, and a ground terminal disposed on an outer surface thereof, and
    - a capacitor formed in one of the first and second rewiring layers and connected between the second terminal and the ground terminal,
    - wherein the ESD protection element is connected between the first terminal and the ground terminal.

14. The filter component according to claim 13, wherein the ESD protection element is formed at the first surface of the semiconductor substrate, and the capacitor is formed in the second rewiring layer.

15. The filter component according to claim 14, wherein the capacitor is an MIM capacitor in contact with the semiconductor substrate and has a plurality of ferroelectric bodies and planar conductors that are alternately arranged relative to each other and laminated together.

16. The filter component according to claim 13, wherein the ESD protection element is formed at the second surface of the semiconductor substrate, and the capacitor is formed in the first rewiring layer.

17. The filter component according to claim 16, wherein the capacitor is an MIM capacitor in contact with the semiconductor substrate and has a plurality of ferroelectric bodies and planar conductors that are alternately arranged relative to each other and laminated together.

18. The filter component according to claim 13, wherein the ESD protection element is formed at the first surface of the semiconductor substrate, and the capacitor is formed in the first rewiring layer.

19. The filter component according to claim 13, wherein the ESD protection element is formed at the second surface of the semiconductor substrate, and the capacitor is formed in the second rewiring layer.

20. The filter component according to claim 13, wherein the capacitor includes a plurality of planar conductors that face each other with at least one inorganic layer disposed therebetween.

* * * * *